(12) United States Patent
Uozumi

(10) Patent No.: US 9,417,102 B2
(45) Date of Patent: Aug. 16, 2016

(54) ABSOLUTE ENCODER, SIGNAL PROCESSING METHOD, PROGRAM, DRIVING APPARATUS, AND INDUSTRIAL MACHINE

(71) Applicant: CANON KABUSHIKI KAISHA, Tokyo (JP)

(72) Inventor: Takayuki Uozumi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/554,803

(22) Filed: Nov. 26, 2014

(65) Prior Publication Data

US 2015/0153205 A1    Jun. 4, 2015

(30) Foreign Application Priority Data

Nov. 29, 2013    (JP) ................................ 2013-247121

(51) Int. Cl.
| | |
|---|---|
| H03M 1/22 | (2006.01) |
| G01D 5/347 | (2006.01) |
| G01D 5/244 | (2006.01) |
| G05B 1/03 | (2006.01) |
| H03M 1/00 | (2006.01) |
| G01S 3/784 | (2006.01) |

(52) U.S. Cl.
CPC ........ *G01D 5/34776* (2013.01); *G01D 5/24476* (2013.01); *G01D 5/3473* (2013.01); *G01D 5/34707* (2013.01); *G01D 5/34715* (2013.01); *G01D 5/34792* (2013.01); *G05B 1/03* (2013.01); *G01S 3/784* (2013.01); *H03M 1/00* (2013.01)

(58) Field of Classification Search
CPC ................................. H03M 1/00; G01S 3/784
USPC .................... 341/7, 8, 13; 250/231.1, 231.13, 250/231.16, 231.18, 231.25, 206.1
See application file for complete search history.

(56) References Cited

U.S. PATENT DOCUMENTS

| | | | |
|---|---|---|---|
| 2004/0173735 A1 | 9/2004 | Williams | |
| 2014/0070073 A1* | 3/2014 | Ishizuka | ............ G01D 5/34776 250/206.1 |

FOREIGN PATENT DOCUMENTS

| | | |
|---|---|---|
| EP | 2416126 A1 | 2/2012 |
| EP | 2565590 A1 | 3/2013 |
| JP | 2012-037392 A | 2/2012 |
| WO | 2010/116144 A2 | 10/2010 |

* cited by examiner

*Primary Examiner* — Joseph Lauture
(74) *Attorney, Agent, or Firm* — Canon U.S.A., Inc. IP Division

(57) ABSTRACT

An absolute encoder includes a scale with a plurality of marks of various types arranged with a space and a period. A detector includes a plurality of elements arranged along a direction corresponding to the aforementioned arrangement, and detects a partial plurality of marks. A signal processor performs amplitude quantization with respect to each period of periodic signals with a plurality of periods output from the detector to generate a data string. First position data having a resolution of the period is generated. The signal processor obtains a plurality of thresholds for the quantization respectively corresponding to a plurality of periodic signals of the periodic signals with the plurality of periods based on a plurality of representative values respectively obtained from the periodic signals with the plurality of periods.

17 Claims, 9 Drawing Sheets

ABSOLUTE ENCODER, SIGNAL PROCESSING METHOD, PROGRAM, DRIVING APPARATUS, AND INDUSTRIAL MACHINE

CROSS-REFERENCE TO RELATED APPLICATIONS

This application claims the benefit of Japanese Patent Application No. 2013-247121, filed Nov. 29, 2013, which is hereby incorporated by reference herein in its entirety.

BACKGROUND OF THE INVENTION

1. Field of the Invention

The present invention relates to an absolute encoder, a signal processing method, a program, a driving apparatus, and an industrial machine.

2. Description of the Related Art

An absolute encoder is capable of reading a mark string corresponding to a binary code such as a gray code and an M sequence code by using a light receiving element array to output absolute position information. Some absolute encoders may use a plurality of mark strings while other absolute encoders may use a single mark string. An absolute encoder using a plurality of mark strings may be based on a scheme for simultaneously reading mark strings on a plurality of tracks on a scale, including a mark string corresponding to a gray code string. This scheme that simultaneously reads a plurality of tracks may require precise attachment of a head and a scale of an encoder with a predetermined positional relationship therebetween, which makes it difficult to achieve both a higher resolution and higher accuracy.

A scheme has been known which has a single mark string on a scale while attempting a higher resolution (Japanese Patent Laid-Open No. 2012-37392). This scheme uses a scale in which a plurality of marks including a plurality of types of marks are arranged with a space and a period. Furthermore, a detector is used which includes a plurality of photoelectric conversion elements arranged along the direction of the scale and detects a plurality of marks of a part of the scale with the photoelectric conversion elements. Then, an amplitude of each period of periodic signals for a plurality of periods output from the detector is quantized to generate a data string. Then, first position data is generated from the data string. The first position data indicates an absolute position along the arrangement of scales or detectors and handles the period as a resolution. Furthermore, second position data is acquired from a phase of a signal for at least one period of the periodic signal. The second position data relates to a section acquired by dividing one period as a resolution. Then, the first position data and the second position data are related as a higher-order bit and a lower-order bit to form data that describes an absolute position.

An encoder based on the scheme according to Japanese Patent Laid-Open No. 2012-37392 has two types of amplitude occurring in a periodic signal if two types of marks are included. Therefore, the two types of amplitude are quantized (binarized) to acquire a binary data string. However, when the attachment state of at least one of a head and a scale of the encoder changes, a signal acquired from a detector may be distorted or may have fluctuating offsets. When a characteristic (such as light transmissivity) of a mark changes, two types of amplitude in a periodic signal acquired from two types of marks may change. Thus, when a fixed threshold value is used for the quantization, an accurate data string indicating an absolute position such as an M sequence code may possibly not be acquired.

SUMMARY OF THE INVENTION

The present invention provides, for example, an absolute encoder that may be advantageous in terms of quantization for acquiring a data string representing an absolute position.

According to an aspect of the present invention, there is provided an absolute encoder including:

a scale in which a plurality of marks including a plurality of types of marks are arranged with a space and a period;

a detector including a plurality of elements arranged along a direction corresponding to a direction in which the plurality of marks are arranged, and configured to detect a partial plurality of marks of the plurality of marks by the plurality of elements; and a signal processor configured to perform quantization of an amplitude with respect to each period of periodic signals with a plurality of periods output from the detector to generate a data string, and generate, based on the data string, first position data which represents an absolute position of the scale or the detector, and has a resolution of the period, wherein the signal processor is configured to obtain a plurality of thresholds for the quantization respectively corresponding to a plurality of periodic signals of the periodic signals with the plurality of periods based on a plurality of representative values respectively obtained from the periodic signals with the plurality of periods.

Further features of the present invention will become apparent from the following description of exemplary embodiments with reference to the attached drawings.

BRIEF DESCRIPTION OF THE DRAWINGS

FIG. 2 illustrates an absolute code string.

DESCRIPTION OF THE EMBODIMENTS

First Exemplary Embodiment

An exemplary embodiment of the present invention will be described with reference to the attached drawings. Like numbers refer like parts in principle (unless otherwise specified) throughout all drawings for explaining exemplary embodiments, and repetitive descriptions will be omitted.

Figure 1:
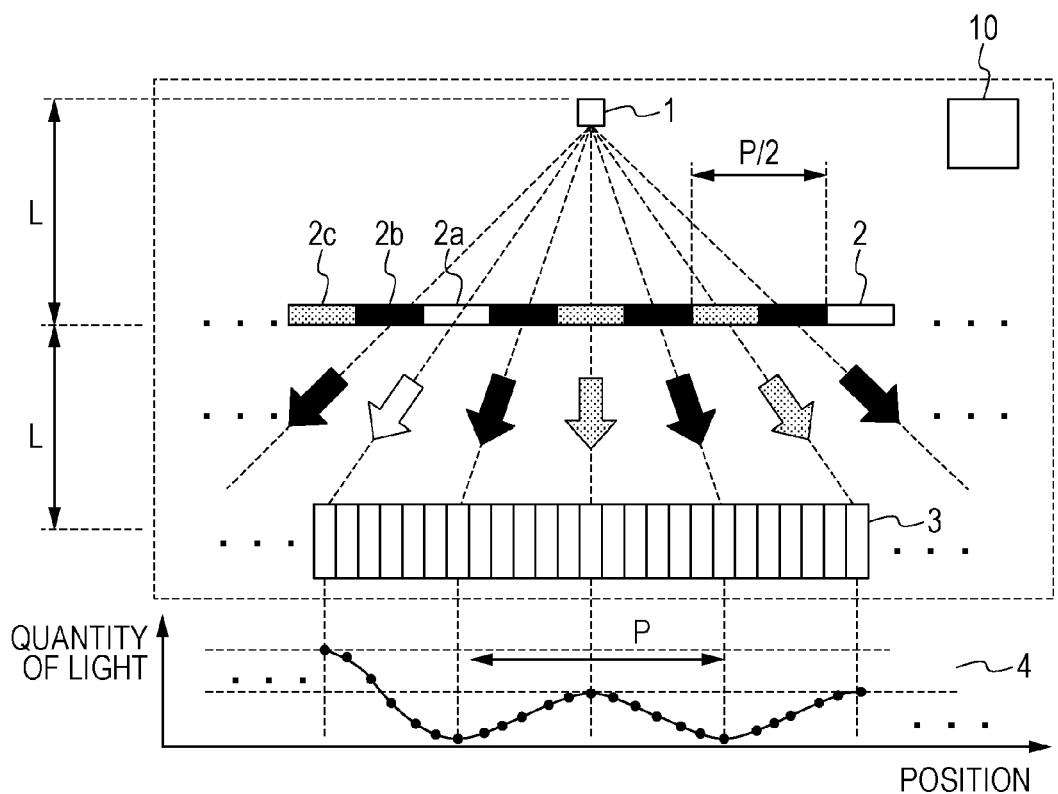
FIG. 1 illustrates a configuration example of an absolute encoder.

FIG. 1 illustrates a configuration example of an absolute encoder according to a first exemplary embodiment. FIG. 1 illustrates a light source 1 such as a light emitting diode (LED), a scale (which may also be called a disk in a case of a rotary encoder) 2, and a detector (light receiving element array) 3 including a plurality of elements (light receiving elements here). In this case, the scale 2 or detector 3 may be movable in the right and left direction of FIG. 1 along with a movable part, not illustrated. In a case of a rotary encoder, the scale or detector is rotatable around a predetermined axis. FIG. 1 further illustrates a signal processing unit 10 configured to process an signal output from the detector 3 and outputs information on an absolute position of the scale 2 or detector 3. A diverged light flux radiated from a light source 1 illuminates the scale 2, and light transmitted through the scale 2 is detected by the detector 3. The scale 2 has a configuration acquired by replacing partial light transmission marks 2a by semi-light-transmission mark 2c in a mark string of an incremental encoder in which light transmission marks 2a and non-light transmission areas 2b are alternately located. An arrangement of the light transmission marks 2a and semi-light-transmission marks 2c represents an absolute code such as an M sequence code associated with an absolute position. The light transmissivities of the light transmission marks 2a, non-light transmission areas 2b, and semi-light-transmission marks 2c may be, for example, 60%, 5%, and 30%, respectively. For example, an absolute code may be represented by defining the light transmission mark 2a as 1 and the semi-light-transmission mark 2c as 0. The absolute code may be an M sequence code or other cyclic codes generated by a primitive polynomial. The light quantity distribution of the light flux transmitted through the scale 2 has a sinusoidal periodicity as if it is acquired by an incremental encoder and as if it is acquired by reflecting information of an absolute code to an amplitude of a sine wave. FIG. 1 further illustrates a light quantity distribution example 4 on a light receiving surface of the detector 3.

The detector 3 may contain a CMOS element or a CCD element. The light receiving elements in the detector 3 are arranged with designed pitches each equal to a value acquired by dividing a designed value P of one period of a light quantity distribution depending on a configuration of an optical system by a natural number N. In this case, phases of signals output by the light receiving elements have equal intervals. For example, when a bit number M of an absolute code is 16, and the number N of light receiving elements corresponding to one period of a light quantity distribution is 12, the number of light receiving elements in the detector 3 may be expressed by N×M=192. Thus, periodic signals for a plurality of periods having information on an absolute position (absolute code string) may be acquired. More light receiving elements than that is preferable for obtaining redundancy. Therefore, a case will be described in which a number of bits to be read L is equal to 20 and the number of light receiving elements is expressed by N×L=240.

When the number of bits to be read L is equal to 20 and if the absolute code is a 16-bit cyclic code, it means that a data string (code string) acquired by reading contains at least one code 1 and one code 0. When arbitrary successive 20 codes are extracted from a 16-bit cyclic code string, a code string containing at least X codes 1 and X codes 0 may be used as an absolute code string.

Figure 2:
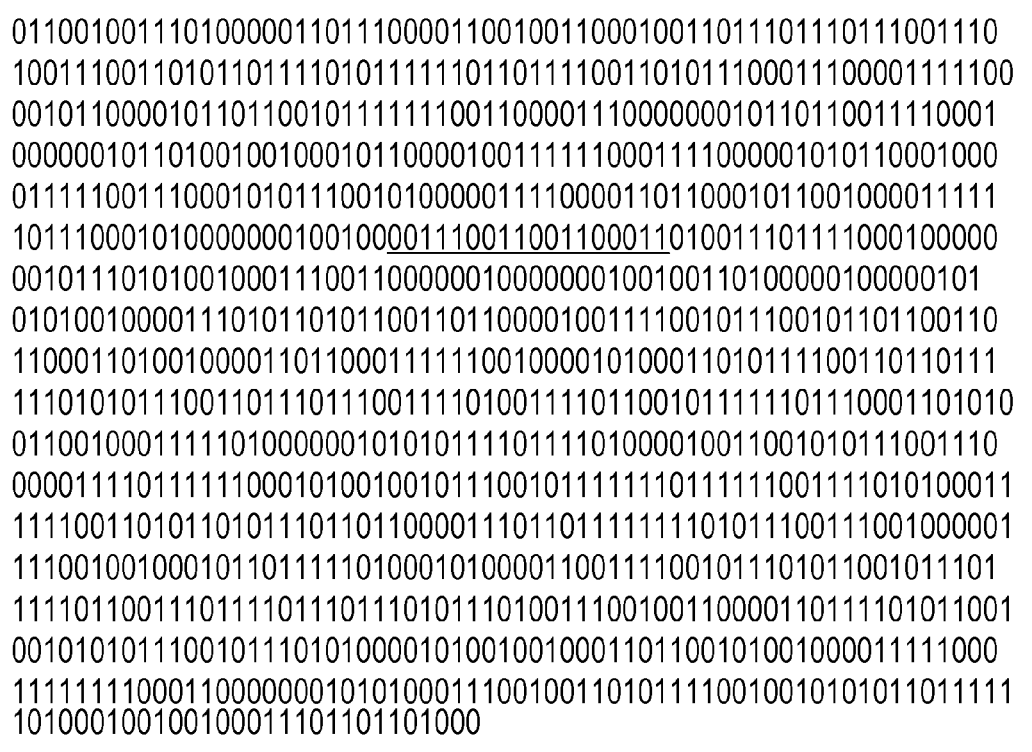

FIG. 2 illustrates an example of an absolute code string. In this example, the code string includes 1250 codes where X=3 (corresponding to periodic codes for 1250 periods). For example, in a case where a designed value P of one period of a light quantity distribution is 160 μm and diverged light as illustrated in FIG. 1 is to be projected to the detector 3 by enlarging the scale 2 to double, the scale 2 may have a length of 100 mm by using the code string illustrated in FIG. 2.

As described above, the absolute encoder according to this exemplary embodiment has the scale 2 in which a plurality of marks including a plurality of types of marks reflecting information of the absolute codes are arranged with a space and a period. The absolute encoder further has the detector 3 which has a plurality of photoelectric conversion elements arranged along a direction corresponding to the arrangement of marks on the scale and detects a plurality of marks of a part of the scale. Here, the expression "direction corresponding to the arrangement" may refer to a changed direction when the direction of the arrangement appears to be changed when viewed through an optical system between the scale 2 and the detector 3 and may be the direction of the arrangement when no change occurs or no optical system exists therebetween. An amplitude of a periodic signal (where information (1 or 0) of an absolute code corresponds to the amplitude) output from the detector 3 is quantized with respect to each of a plurality of periods of the periodic signal to generate a data string (absolute code string). Furthermore, first position data is generated from the data string. The first position data describes an absolute position along the scale or the arrangement of the detector, and the period is defined as a resolution. Second position data is acquired from a phase of a signal for at least one period of periodic signals for the plurality of periods, and a section acquired by dividing the periods is defined as a resolution. The first position data and second position data are then connected as a higher-order bit and a lower-order bit, respectively, to generate data representing an absolute position. Thus, high-resolution absolute position information may be acquired. In this example where the designed value P of one period of a light quantity distribution is equal to 160 μm, absolute position information may be acquired from a combination of first position data acquired with a resolution of 80 μm and second position data acquired with a resolution equal to a section (length) acquired by dividing 80 μm by a natural number Q. For example, when the natural number Q is 1000, absolute position information is acquired with a resolution of 0.08 μm.

Figure 3:
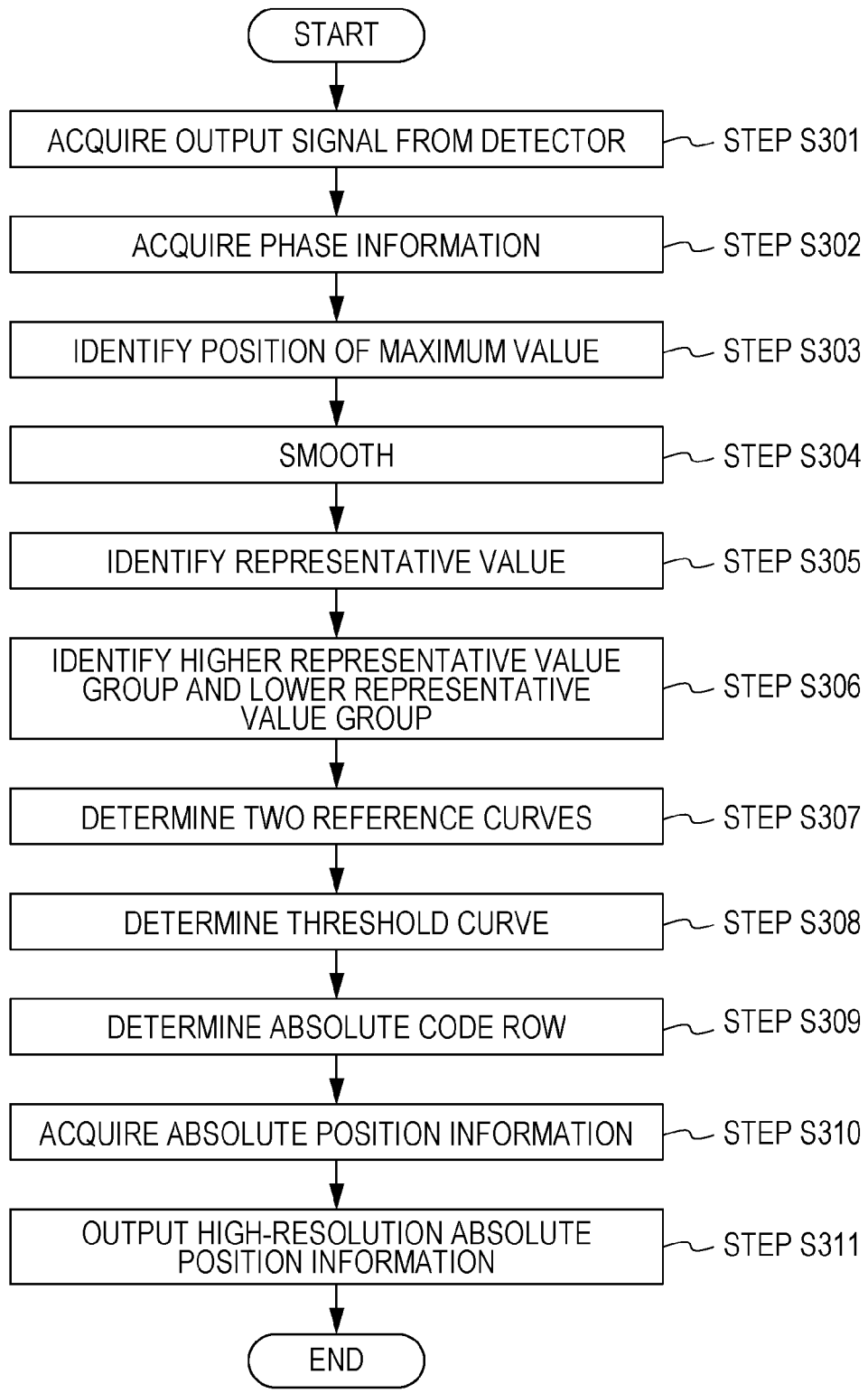
FIG. 3 is a flowchart of a signal processing in a signal processing unit.
Figure 4A:
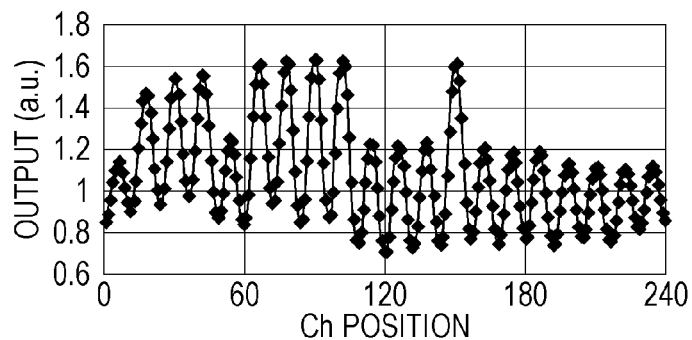
FIGS. 4A to 4E illustrate examples of details of the signal processing.

FIG. 3 is a diagram (flowchart) illustrating a flow of signal processing in a signal processing unit 10. Signal processing using the code string illustrated in FIG. 2 will be described with reference to FIGS. 3 and 4A to 4E. FIGS. 4A to 4E illustrate examples of details of the signal processing. The flowchart in FIG. 3 illustrates signal processing for each predetermined processing period to be performed by the signal processing unit 10. The signal processing is executed by a programmed CPU, DSP, FPGA or the like. Without limiting thereto, at least a part of the signal processing may be executed by a well-known device such as an analog circuit. First, in step S301, output signals from the light receiving elements are acquired. Analog signals output serially from the receiving elements are signals (voltage) reflecting a light quantity distribution on the detector 3 and are sequentially A/D converted and are stored in a memory (storage unit), not illustrated, as a digital data string. FIG. 4A illustrates an example of a digital data string corresponding to a part of the underlined code string in FIG. 2. The data string is acquired with the head and scale having ideal states.

Next, in step S302, the data string acquired in S301 is used to acquire phase information (corresponding to the second position data). The acquisition of phase information corresponds to acquisition of a phase of a periodic signal with respect to at least one period thereof from the data string. A total sum is acquired for values obtained by multiplying a data string and a reference data string of four reference data strings. The four reference data strings may correspond to the following expressions:

$$(1-\sin \Omega t)/2 \qquad \text{[Expression 1]}$$

$$(1-\cos \Omega t)/2 \qquad \text{[Expression 2]}$$

$$(1+\sin \Omega t)/2 \qquad \text{[Expression 3]}$$

$$(1+\cos \Omega t)/2 \qquad \text{[Expression 4]}$$

Here ω is a value obtained by multiplying 2π with a spatial frequency (inverse of a period) of each of the four reference data strings. And t is a position in each of the four reference data strings.

Thus, what are called an A(+)-phase signal value, a B(+)-phase signal value, an A(−)-phase signal value and a B(−)-phase signal value are acquired. Then, an arc tangent value of a value((A(+)-phase signal value-A(−)-phase signal value)/(B(+)-phase signal value-B(−)-phase signal value)) acquired by dividing an A-phase signal value by a B-phase signal value is acquired to acquire phase information with a resolution equivalent to that of an incremental encoder. It should be noted that each reference data string has a period equivalent to that of the periodic signal with the plurality of periods. The number of reference data strings is not limited to four but may be two or more, and the phase of a data string may be acquired in a manner suitable for a combination of reference data strings.

Next, in step S303, a position of a local maximum value in the data string (corresponding to a light quantity distribution or periodic signals for a plurality of periods) is identified based on the phase of the data string acquired in step S302. In this example where periodic signals for 20 periods are acquired by 240 light receiving elements, 20 local maximum values (or data taking them) are displaced in accordance with the phase of the data string in the periodic signals (or a data string relating to them) for 20 periods. Therefore, it is apparent that a position of a local maximum value (or data taking a local maximum value) in the data string may be identified based on the phase. It should be noted that a local minimum value may be used instead of such a local maximum value in some configurations of marks in the scale and may be generally an extremum value. The method for identifying a position of a local maximum value (extremum value) is not limited to the method based on the phase acquired in S302 but may be a method which acquires a differentiation (slope) of a data string or a data string acquired by smoothing it or other methods.

Figure 4B:
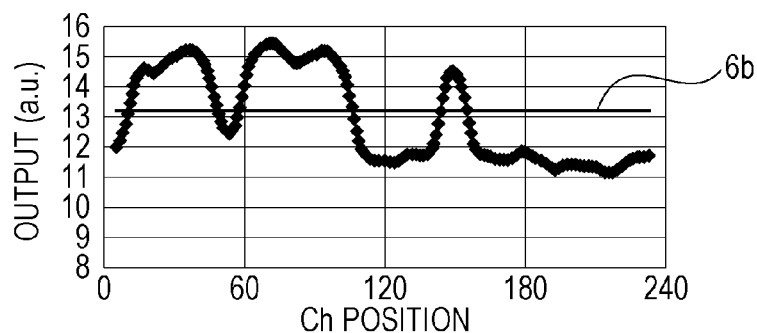

Next, in step S304, the data string is smoothed to acquire smoothed data. The smoothing may be performed by calculating a total sum of a value of each data of a data string and a value of predetermined data adjacently preceding or succeeding the each data. In this case, based on the fact that one period of the light quantity distribution corresponds to 12 light receiving elements, a total sum of values of 11 data pieces including five preceding and five subsequent adjacent data pieces. However, such a total sum may not be acquired for data pieces corresponding to five elements at edges of the detector 3. Therefore, such data pieces are excluded from the smoothed data. FIG. 4B illustrates smoothed data corresponding to a data string in FIG. 4A.

Figure 4C:
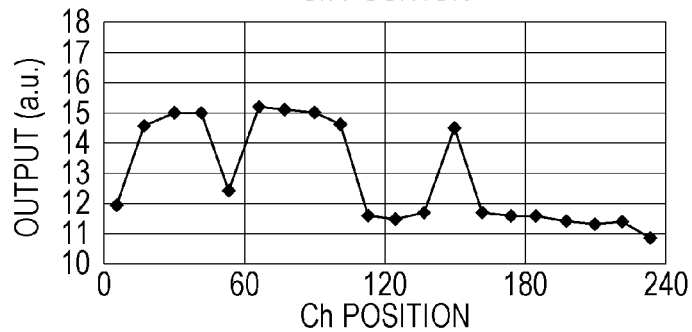

Next, in step S305, in the smoothed data acquired in step S304, representative values corresponding to the positions of the local maximum values acquired in step S303 are identified. In FIG. 4C, such identified representative values are indicated by black dots. The number of representative values to be identified is equal to 20 that is equal to the number of bits to be read L=20. It should be noted that each of the representative values is a representative value for each periodic signal among periodic signals for the plurality of period and corresponds to (or correlated with) an amplitude of each periodic signal. In other words, each representative value is not limited to a value of a smoothed data corresponding to the position of a local maximum value (extremum value) and may be a one corresponding to (correlated with) an amplitude of a periodic signal, such as a local maximum value (extremum value), a half value, a half value width, a total sum value (average value) of the periodic signal.

Next, in step S306, higher three and lower three representative values of the 20 representative values acquired in step S305 are identified as a higher representative value group and a lower representative value group, respectively. The absolute code string in FIG. 2 includes at least three is and at least three 0s in the code string of the number of bits to be read L=20. Therefore, it may be considered that the higher representative value group and lower representative value group identified from the smoothed data correspond to code 1 and code 0, respectively.

Next, in step S307, the higher representative value group and the lower representative value group acquired in step S305 are used to determine two reference curves (regression equations) corresponding to code 1 and code 0. In this case, the reference curves are quadratic curves. For example, a reference curve corresponding to code 1 and a reference curve corresponding to code 0 may be expressed by the following expressions:

$$y1 = a1 \times x1^2 + b1 \times x1 + c1 \qquad \text{[Expression 5]}$$

$$y2 = a0 \times x2^2 + b0 \times x2 + c0 \qquad \text{[Expression 6]}$$

Figure 4D:
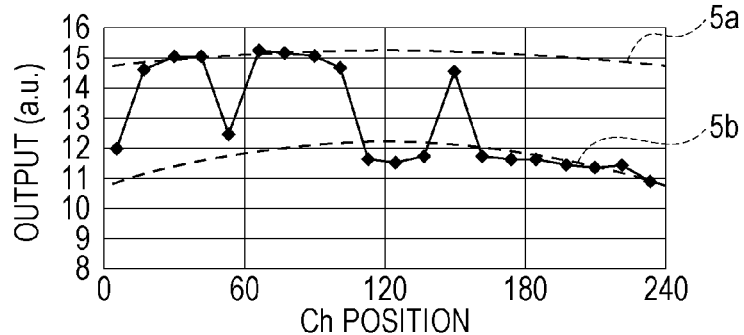
Figure 4E:
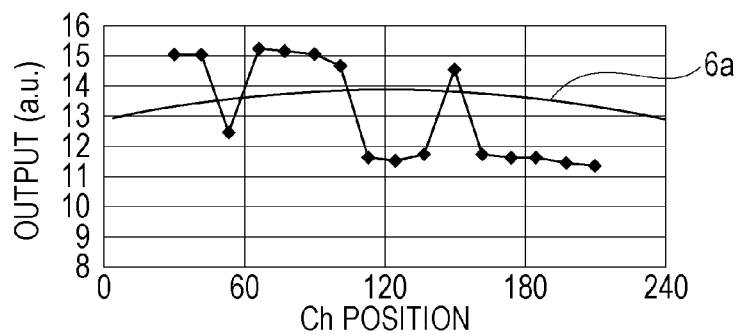

In this case, y1 and y2 are a value of the regression equation (Expression 5) relating to the higher representative value group and a value of the regression equation (Expression 6) relating to the lower representative value group. x1 and x2 are a position of a data piece in the higher representative value group and a position of a representative value in the lower representative value group. a1, a0, b1, b0 may be prepared fixed values. Theses fixed values may be determined by using a digital data string acquired in advance from an actual light quantity distribution. Alternatively, they may be determined based on a simulated light quantity distribution. c1 and c0 may be acquired by using one representative value of each of representative value groups, for example. FIG. 4D illustrates a reference curve 5a relating to the higher representative value group and a reference curve 5b relating to the lower representative value group.

Next, in step S308, a threshold value curve 6a is acquired based on the two reference curves 5a, 5b acquired in step S307. FIG. 4 exemplarily illustrates the threshold value curve 6a. In this case, the threshold value curve 6a is acquired by averaging (calculating an arithmetic mean of) two values corresponding to the two reference curves 5a and 5b.

Next, in step S309, a threshold value depending on the threshold value curve 6a acquired in step S308 is used to quantize (binarize) the representative values acquired in step S305 to acquire absolute codes and thus determine an absolute code string. Here, two end codes (a total of four codes) in the acquired absolute code string correspond to 4 bits because of the redundancy and therefore are excluded from the absolute code string. In this case, an absolute code string 11011110000100000 is acquired.

Next, in step S310, absolute position information (first position data) is acquired from the absolute code string acquired in step S309. For example, absolute position information corresponding to the absolute code string may be acquired with reference to a lookup table prepared in advance. Table 1 illustrates a part of a lookup table illustrating a correspondence relationship between the absolute code string in FIG. 2 and absolute position information. For example, absolute position information corresponding to a absolute code string 1101111000100000 is 40.64 mm.

TABLE 1

| Absolute Code | Absolute Position Information (mm) |
|---|---|
| 1010000011100100 | 0.08 |
| 0100000111001000 | 0.16 |
| 1000001110010000 | 024 |
| 0000011100100001 | 032 |
| 0000111001000011 | 0.4 |
| ... | ... |
| 0011101111000100 | 40.4 |
| 0111011110001000 | 40.48 |
| 1110111100010000 | 40.56 |
| 1101111000100000 | 40.64 |
| 1011110001000000 | 40.72 |
| 0111100010000000 | 40.8 |
| 1111000100000001 | 40.88 |
| ... | ... |
| 0100011100001011 | 99.68 |
| 1000111000010111 | 99.76 |
| 0001110000101110 | 99.84 |
| 0011100001011100 | 99.92 |
| 0111000010111000 | 100 |

Finally, in step S311, absolute position information with a high resolution acquired by combining the absolute position information acquired in step S310 and the phase information acquired in step S302 is output.

Figure 5:
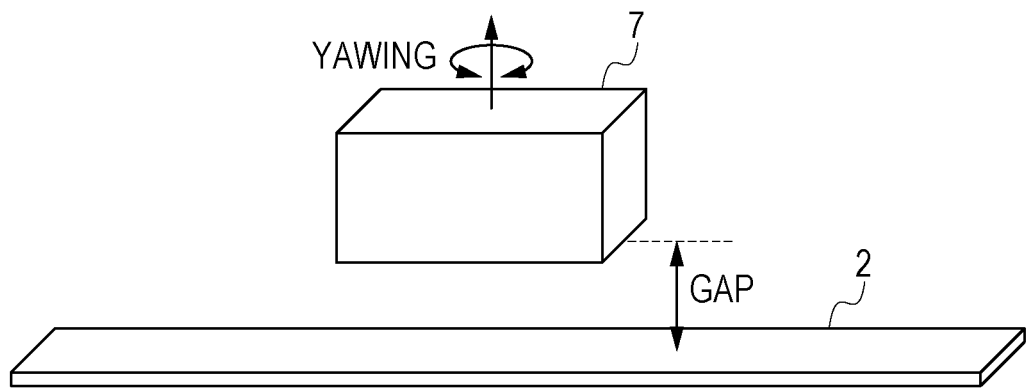
FIG. 5 illustrates a positional relationship between a scale and a head.

FIG. 5 illustrates a positional relationship between the scale and a head. FIG. 5 illustrates a head 7 including the light source 1 and the detector 3. The illustrated scale 2 is not light transmissive but is light reflective. Determination of an absolute code string under various conditions will be described with reference to FIGS. 5 to 8D.

Figure 6A:
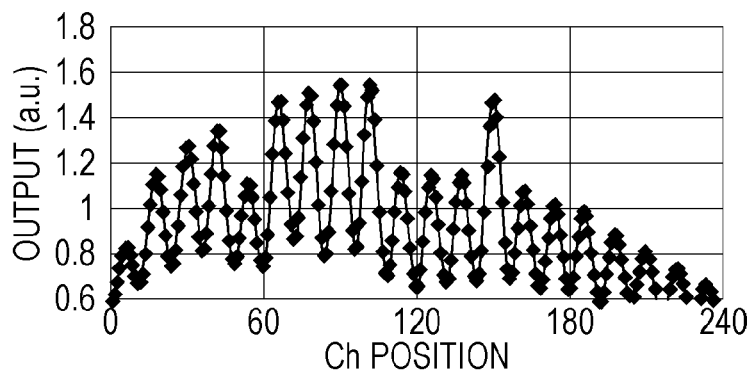
FIGS. 6A to 6D illustrate details of signal processing to be performed when the positional relationship changes.
Figure 6B:
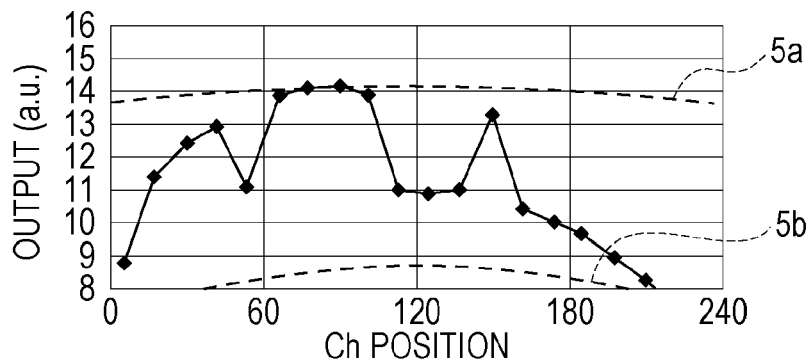
Figure 6C:
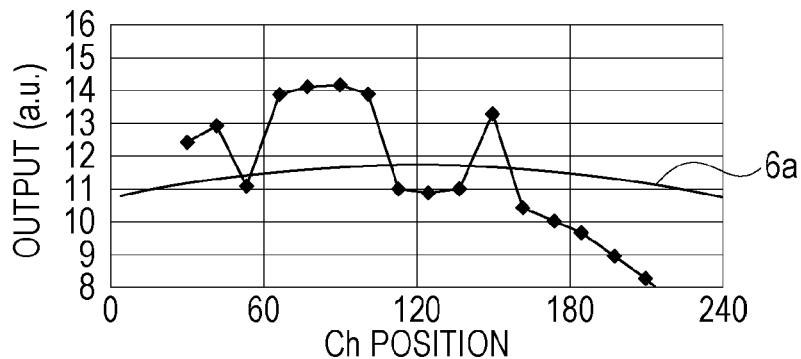
Figure 6D:
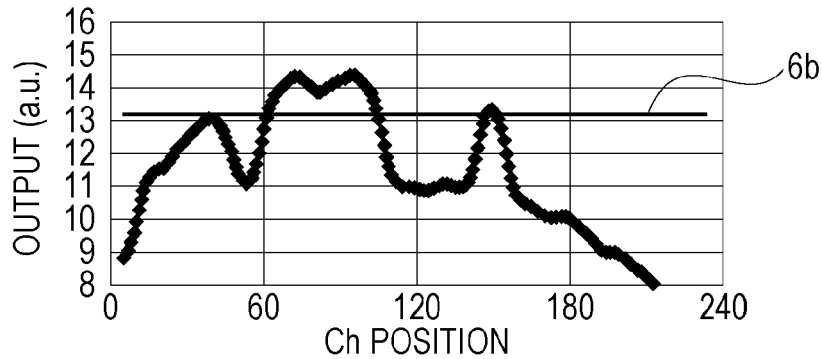

A case is illustrated in which an interval (Gap) between the scale 2 and the head 7 is misaligned from a designed value. FIG. 6A illustrates a data string acquired in step S301 with an increased interval therebetween (where an amount of difference from a designed value ΔGap=+0.4 mm). FIG. 6A illustrates a data string acquired by reading a region of the scale 2 corresponding to the data string illustrated in FIG. 4A. It is understood that the data string in FIG. 6A is distorted, compared with that in FIG. 4A. FIGS. 6B and 6C correspond to FIGS. 4D and 4E, respectively. By determining the threshold value curve 6a as in FIG. 6C after two reference curves 5a and 5b are determined as in FIG. 6B, an absolute code string 1101111000100000 is acquired based on threshold values at positions of representative values depending on the threshold value curve. The absolute code string agrees with the absolute code string acquired from the data string in FIG. 4A acquired with an ideal interval (Gap). On the other hand, FIG. 6D exemplarily illustrates a case where the method disclosed in Japanese Patent Laid-Open No. 2012-37392 using the predetermined fixed threshold value 6b from a specification (designed value) of the absolute encoder, without using the threshold values according to this exemplary embodiment. It may be understood that some data in the smoothed data to be quantized as the code 1 may have values under the threshold value 6b. In this case, the resulting absolute code string is 0001111000100000. In the first 2 digits, a digit to be quantized as code 1 is wrongly quantized as code 0.

Figure 7A:
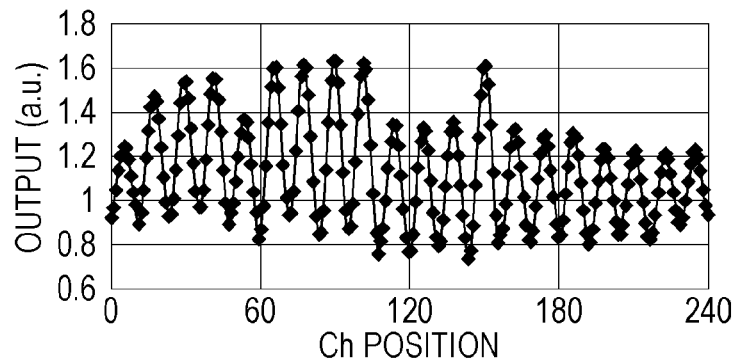
FIGS. 7A to 7D illustrate details of signal processing to be performed when a mark characteristic changes.
Figure 7B:
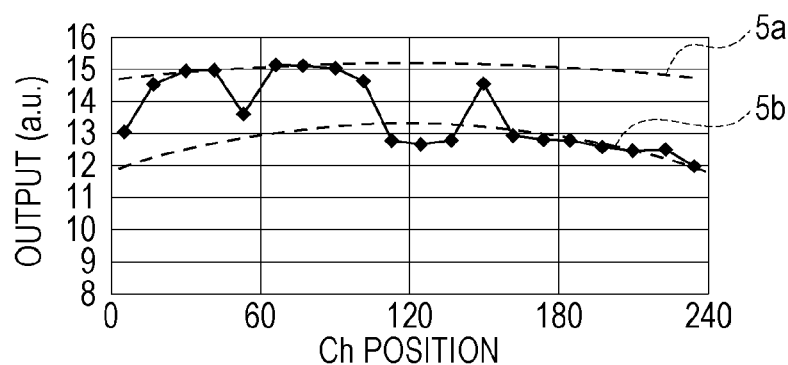
Figure 7C:
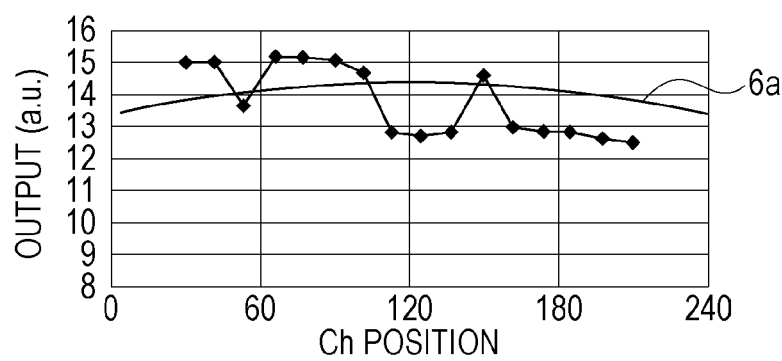
Figure 7D:
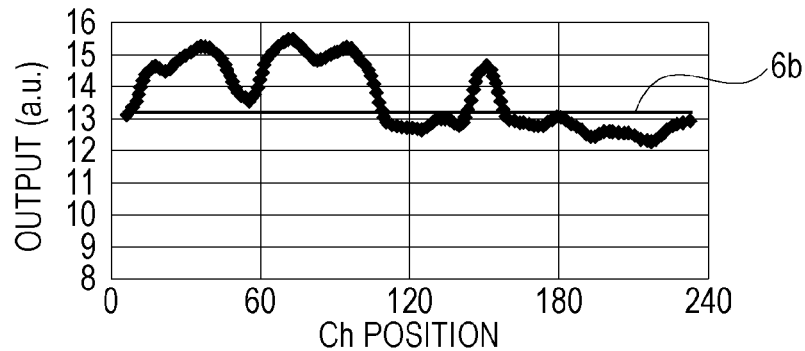

Next, a case will be described in which the transmissivity of a semi-light-transmission mark on the scale is different from a designed value. FIG. 7A illustrates a data string acquired in step S301 in a case where the light transmissivity of the semi-light-transmission mark increases (a change of light transmissivity by +10%). FIG. 7A illustrates a data string acquired by reading a region of the scale 2 corresponding to the data string illustrated in FIG. 4A. It may be understood that a difference between two types of amplitude acquired from respective two types of marks, compared with the data string illustrated in FIG. 4A. FIGS. 7B and 7C correspond to FIGS. 4D and 4E, respectively. By determining the threshold value curve 6a as in FIG. 7C after the two reference curves 5a and 5b are determined as in FIG. 7B, an absolute code string 1101111000100000 is acquired based on threshold values at positions of the representative values depending on the threshold value curves. This absolute code string is matched with an absolute code string acquired from the ideally acquired data string in FIG. 4A. On the other hand, FIG. 7D exemplarily illustrates a case where the method disclosed in Japanese Patent Laid-Open No. 2012-37392 using the fixed threshold value 6b is applied. Apparently, some of smoothed data to be quantized as code 0 are higher than the threshold value 6b. In this case, the resulting absolute code string is 1111111000100000, and the third digit to be quantized as code 0 is wrongly quantized as code 1.

Figure 8A:
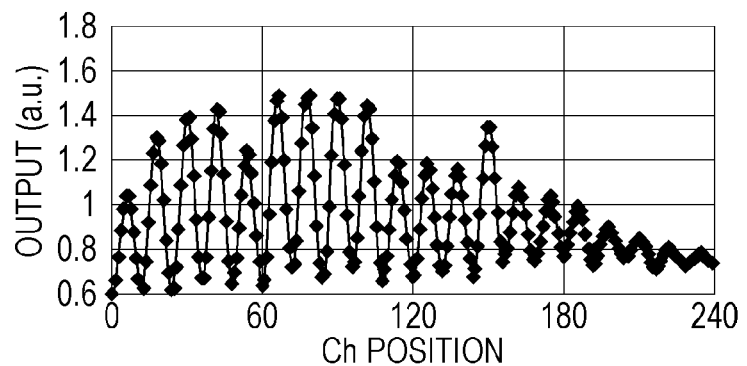
FIGS. 8A to 8D illustrate details of signal processing to be performed when the positional relationship and mark characteristic change.
Figure 8B:
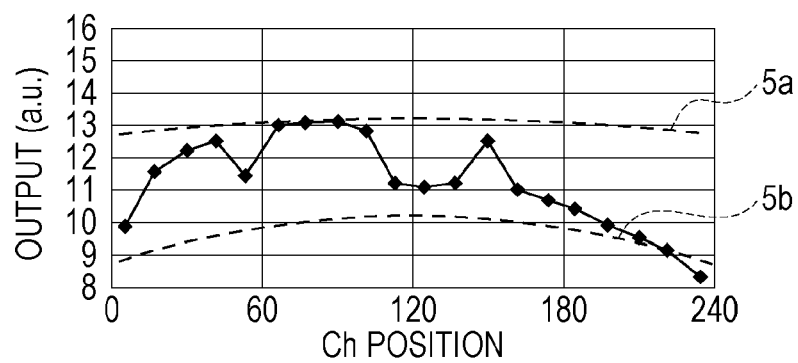
Figure 8C:
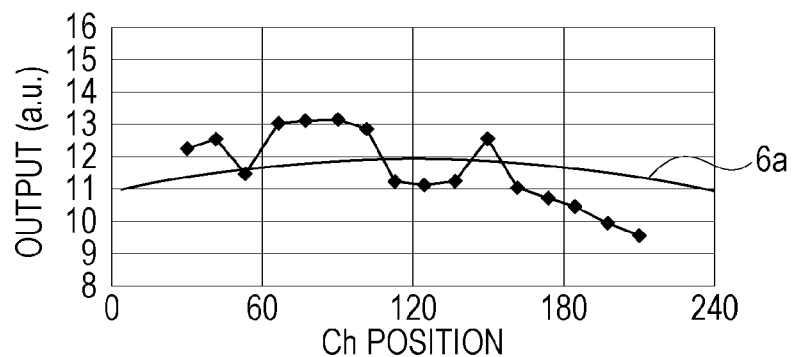
Figure 8D:
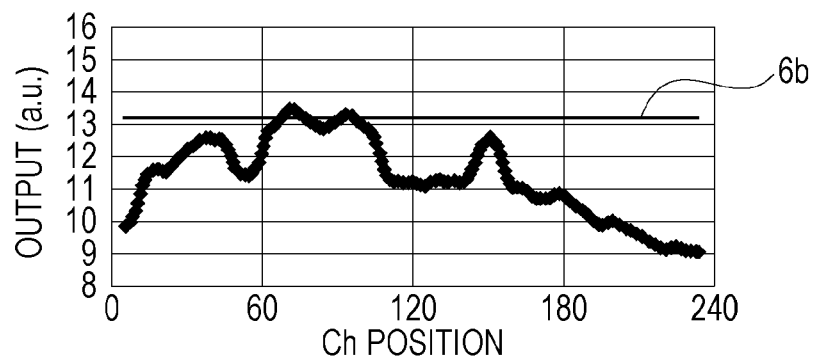

FIG. 8A further illustrates a case where the positional relationship between the scale 2 and the head 7 is different from its ideal state (designed value) and the transmissivity of marks on the scale is different from its designed value. There are differences in Gap (ΔGap=+0.3 mm) and in yawing of the head (Yawing=2 deg). Furthermore, there are a difference in light transmissivity of the light transmission marks (change in light transmissivity is equal to −10%) and a difference in light transmissivity of the semi-light-transmission marks (change in light transmissivity is equal to +10%). FIG. 8A illustrates a data string acquired in step S301 in that case. FIG. 8A illustrates a data string acquired by reading the region of the scale 2 corresponding to the data string illustrated in FIG. 4A. The data string in FIG. 8A is distorted, compared with the data string illustrated in FIG. 4A, and, apparently, there is a reduced difference between two types of amplitude acquired from two types of marks. FIGS. 8B and 8C correspond to FIGS. 4D and 4E, respectively. By determining the threshold value curve 6a as in FIG. 8C after the two reference curves 5a and 5b are determined as in FIG. 8B, an absolute code string 1101111000100000 is acquired based on threshold values at positions of representative values depending on the threshold value curve. This absolute code string is matched with the absolute code string acquired from the ideally acquired data string in FIG. 4A. On the other hand, FIG. 8D exemplarily illustrates a case where the method disclosed in Japanese Patent Laid-Open No. 2012-37392 using the fixed threshold value 6b is applied. Apparently, the entire smoothed data are below the threshold value 6b. In this case, the acquired absolute code string is 0000000000000000 which are all 0 and are apparently wrong.

Tables 2, 3, and 4 summarize results of comparison between a scheme according to this exemplary embodiment and the scheme disclosed in Japanese Patent Laid-Open No. 2012-37392 with regard to wrong determination of an absolute code string under various conditions as described above. On those tables, "OK" is shown if no error exists while "NG" is shown if some error exists. Table 2 illustrates comparison results in a case where the difference in Gap only is changed. Table 3 illustrates comparison results in a case where the difference in transmissivity of semi-light-transmission marks on the scale only is changed. Table 4 illustrate comparison results where there are a difference in gap equal to +0.3 mm, a difference in light transmissivity of light transmission marks equal to −10%, and a difference in light transmissivity of semi-light-transmission marks equal to +10% and the yawing is changed from −3 deg to +3 deg. These comparison results show with respect to the determination of an absolute code string that the scheme of this exemplary embodiment is more highly robust against at least one installation error of the scale and head and a change in characteristic of marks on the scale than the scheme disclosed in Japanese Patent Laid-Open No. 2012-37392. In other words, according to this exemplary embodiment, an absolute encoder may be provided which is advantageous for quantization to be performed to acquire a data string representing an absolute position.

TABLE 2

| Difference in Space (mm) | Japanese Patent Laid-Open No. 2012-37392 | The Present Invention |
| --- | --- | --- |
| −0.4 | NG | OK |
| −0.3 | OK | OK |
| −0.2 | OK | OK |
| −0.1 | OK | OK |
| 0 | OK | OK |
| 0.1 | OK | OK |
| 0.2 | OK | OK |
| 0.3 | OK | OK |
| 0.4 | NG | OK |

TABLE 3

| Difference In Light Transmissiviy Of Semi-Light-Transmission Marks (%) | Japanese Patent Laid-Open No. 2012-37392 | The Present Invention |
| --- | --- | --- |
| 0 | OK | OK |
| 2 | OK | OK |
| 4 | OK | OK |
| 6 | OK | OK |
| 8 | NG | OK |
| 10 | NG | OK |

TABLE 4

| Yawing (deg) | Japanese Patent Laid-Open No. 2012-37392 | Present Invention |
| --- | --- | --- |
| −3 | NG | OK |
| −2 | NG | OK |
| −1 | NG | OK |
| 0 | NG | OK |
| 1 | NG | OK |
| 2 | NG | OK |
| 3 | NG | OK |

Other Exemplary Embodiments

According to the first exemplary embodiment, partial light transmission marks 2a are replaced by semi-light-transmission marks 2c in an incremental pattern including the light transmission marks 2a and non-light transmission areas 2b to configure an absolute code pattern. Instead of this, partial non-light transmission areas 2b may be replaced by the semi-light-transmission marks 2c to represent an absolute code string by using the non-light transmission areas 2b and the semi-light-transmission marks 2c.

Having described an encoder having a light transmission type scale, it may be an encoder having a light reflective scale.

Having described that diverged light is used as illustrated in FIG. 1, parallel light or converged light may be used.

Having described the number N of light receiving elements corresponding to one period of a light quantity distribution is equal to 12, N may be changed to 3, 4, 6, 8 or the like. It may be changed in accordance with the designed value for one period of a light quantity distribution, the designed value for each pitch of marks on the scale and the configurations of an optical system and a light receiving element array to be adopted.

Having described exemplarily an absolute code string containing at least X=3 code is and three code 0s in the number of bits to be read L=20, the numerical value X may be changed properly in consideration of the scale length and the number of elements in the light receiving element array.

Having described the method for acquiring a reference curve by using representative values of smoothed data at local maximum values of a data string, representative values may be selected from smoothed data instead of those at the local maximum values. Because an absolute code string is adopted which contains at least X=1 code 1 and code 0 in the number of bits to be read L=20, the local maximum value and local minimum value of the smoothed data may be regarded as corresponding to code 1 and code 0. Therefore, such local maximum and local minimum values of smoothed data may be used to acquire a reference curve.

Having described that one representative value is selected to use for calculating c1 and c0 based on Expression 5 and Expression 6, respectively, it may be changed as required. For example, an average value of three representative values may be used for calculating each of c1 and c0. It may be configured such that absolute code strings of c1, c0 acquired from a plurality of combinations of representative values may be acquired, and an absolute code string having a high coincidence degree may be selected among the acquired plurality of absolute code strings. In this case, if there is no absolute code string having a high coincidence degree, an error signal may be output. Having described that c1 and c0 are only variables, a1, a0, b1, and b0 may also be variables. The number of such variables may be changed in accordance with the selected value X. The reference curve is not limited to a quadratic curve but may be any other degree curve.

The two reference curves for acquiring a threshold value curve may be averaged not using an arithmetic mean but using a weighted mean.

It may be configured such that an error signal may be output if the acquired absolute code string is not on the lookup table.

The example has been described in which the first position data and second position data are connected as a higher-order bit and a lower-order bit, respectively to generate data representing an absolute position. However, an embodiment of the present invention is not limited thereto. For example, data representing an absolute position may be generated only from the first position data at all times or as required in accordance with the resolution required by the application or operation mode of an apparatus including the absolute encoder. In this case, the function for generating the second position data may be omitted or stopped.

Though the detector 3 includes an array of light receiving elements (photoelectric conversion elements) configured to detect a light quantity, an embodiment of the present invention is not limited thereto. An array of various elements may be included in accordance with the characteristic of marks included in the scale 2. In other words, the element may only be required to detect any physical quantity corresponding to a characteristic for distinguishing a plurality of types of marks. For example, in a case where a plurality of types of (permanent)magnet generating magnetic fields having different sizes from each other are provided as a plurality of types of marks included in the scale, the detector 3 may include an array of magnetism (magnetic field) detecting elements such as Hall effect elements.

Application Examples

Figure 9:
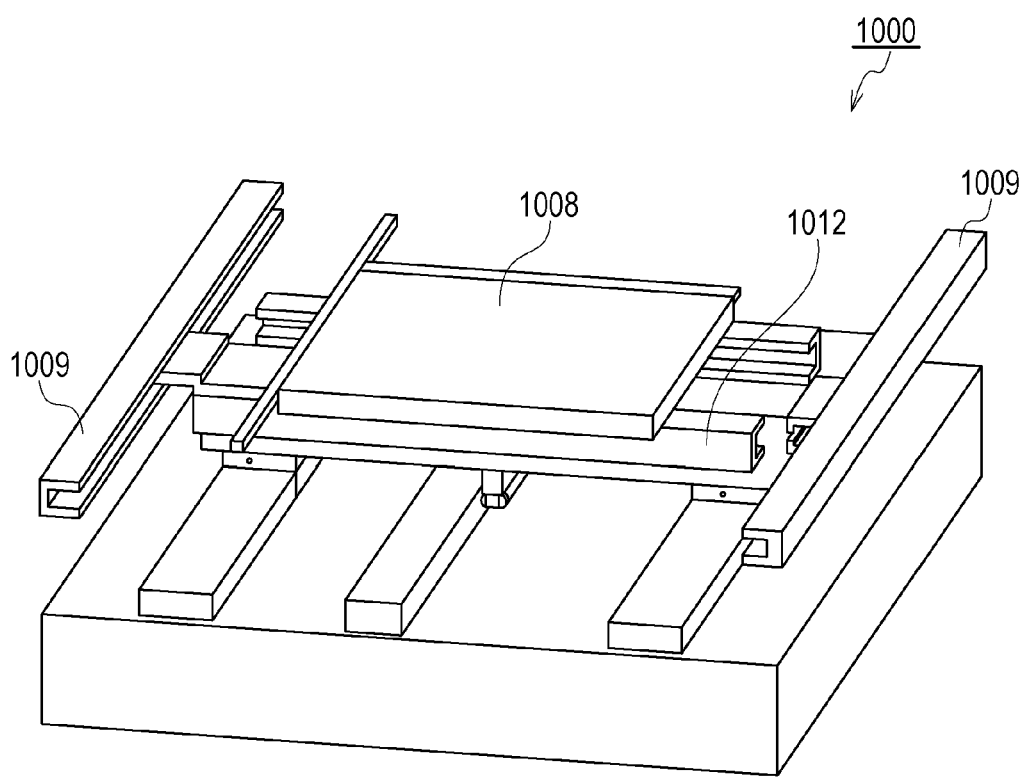
FIG. 9 illustrates an application (or usage) example of an absolute encoder.
Figure 9:
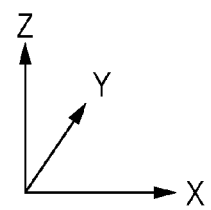

Application examples of the absolute encoder will be described as other exemplary embodiments. Because the absolute encoder does not require an operation for origin (reference position) detection, it is useful in various driving apparatuses and robots, transportation machines or apparatuses including them (including apparatuses relating to construction processing, measurement, and preparation). Such a driving apparatus may include a movable part, an absolute encoder configured to measure an absolute position relating to a movement of the movable part, and a driving unit (also referred to as a driving device or an actuator) configured to perform driving relating to a movement (motion) of the movable part based on an output from the absolute encoder. An application example to a stage (XY stage) apparatus provided in a lithography system (such as an exposure system) that is an industrial apparatus will be described below, for example. FIG. 9 illustrates a configuration example of a stage apparatus 1000 according to the application example.

A lithography system is configured to form a pattern on a substrate and may be implemented as an exposure system, a drawing system, an imprinting system. The exposure system may form a (latent image) pattern on a (resist on) a substrate by using (extreme) ultraviolet rays. The drawing apparatus may form a (latent image) pattern on a (resist on) a substrate by using a charged particle beam (such as an electron beam), for example. The imprinting system may form a pattern on a substrate by forming an imprinting material on the substrate.

The stage 1000 includes, as illustrated in FIG. 9, a Y-axis motor 1009 (driving unit) usable for movement of a stage 1008 (movable part) in a Y axis direction and an X-axis motor 1012 (driving unit) usable for movement of the stage 1008 in an X axis direction. In this case, for example, the scale 2 of the absolute encoder may be attached to one of a stator and a movable element of each of the motors and the detector 3 of the absolute encoder may be attached to the other so that an absolute position of the stage 1008 may be acquired.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-247121, filed Nov. 29, 2013, which is hereby incorporated by reference herein in its entirety.

What is claimed is:

1. An absolute encoder comprising:
a scale in which a plurality of marks including a plurality of types of marks are arranged with a space therebetween and at a period;
a detector including a plurality of elements arranged along a direction corresponding to a direction in which the plurality of marks are arranged, and configured to detect a partial plurality of marks of the plurality of marks by the plurality of elements; and
a signal processor configured to perform quantization of an amplitude with respect to each period of periodic signals with a plurality of periods output from the detector to generate a data string, and generate, based on the data string, first position data which represents an absolute position of the scale or the detector, and has a resolution of the period,
wherein the signal processor is configured to obtain a plurality of thresholds for the quantization respectively corresponding to a plurality of periodic signals of the periodic signals with the plurality of periods based on a plurality of representative values obtained from the periodic signals with the plurality of periods.

2. The absolute encoder according to claim 1, wherein the signal processor is configured to obtain smoothed data by smoothing the periodic signals with the plurality of periods, and obtain the plurality of thresholds by using the plurality of representative values selected from the smoothed data.

3. The absolute encoder according to claim 2, wherein the smoothing includes obtaining, with respect to a specified element of the plurality of elements, a total sum of outputs from elements, of the plurality of elements, including the specified element.

4. The absolute encoder according to claim 2, wherein the signal processor is configured to select the plurality of representative values from the smoothed data based on information on a phase of a signal, with at least one period, of the periodic signals with the plurality of periods.

5. The absolute encoder according to claim 4, wherein the signal processor is configured to select, as the plurality of representative values, a plurality of higher representative values and a plurality of lower representative values of values, of the smoothed data, respectively corresponding to specified phases of the signal of the periodic signals with the plurality of periods.

6. The absolute encoder according to claim 5, wherein the signal processor is configured to represent the plurality of higher representative values with a first regression equation, and represent the plurality of lower representative values with a second regression equation, and obtain the plurality of thresholds based on the first regression equation and the second regression equation.

7. The absolute encoder according to claim 6, wherein the signal processor is configured to obtain each of the plurality of thresholds by averaging a value acquired by the first regression equation and a value acquired by the second regression equation.

8. The absolute encoder according to claim 5, wherein the specified phases are phases at which the signal of the periodic signals with the plurality of periods have extremum values.

9. The absolute encoder according to claim 4, wherein the signal processor is configured to generate a plurality of phase signals having phases different from each other based on the signal with the at least one period, and obtain the information on the phase based on the plurality of phase signals.

10. The absolute encoder according to claim 4, wherein the signal processor is configured to obtain second position data with a resolution higher than a resolution of the period based on the information on the phase.

11. The absolute encoder according to claim 10, wherein the signal processor is configured to generate data representing an absolute position by connecting the first position data and the second position data respectively as higher bits and lower bits.

12. The absolute encoder according to claim 2, wherein the signal processor is configured to quantize the plurality of representative values respectively corresponding to the plurality of thresholds respectively based on the plurality of thresholds to generate the data string.

13. The absolute encoder according to claim 1, wherein the absolute encoder is configured as a rotary encoder.

14. A driving apparatus comprising:
a movable part;
an absolute encoder according to claim 1 configured to measure an absolute position relating to a motion of the movable part; and
a driving device configured to perform driving relating to the motion of the movable part based on an output of the absolute encoder.

15. An industrial machine comprising the driving apparatus according to claim 14.

16. A signal processing method for an absolute encoder including
a scale in which a plurality of marks including a plurality of types of marks are arranged with a space therebetween and at a period;
a detector including a plurality of elements arranged along a direction corresponding to a direction in which the plurality of marks are arranged, and configured to detect a partial plurality of marks of the plurality of marks by the plurality of elements; and
a signal processor configured to perform quantization of an amplitude with respect to each period of periodic signals with a plurality of periods output from the detector to generate a data string, and generate, based on the data string, first position data which represents an absolute position of the scale or the detector, and has a resolution of the period, the method comprising a step of:
obtaining a plurality of thresholds for the quantization respectively corresponding to a plurality of periodic signals of the periodic signals with the plurality of periods based on a plurality of representative values obtained from the periodic signals with the plurality of periods.

17. A program for causing a computer to execute the signal processing method according to claim 16.

* * * * *